(12) United States Patent
Jang et al.

(10) Patent No.: US 10,374,124 B2
(45) Date of Patent: Aug. 6, 2019

(54) LIGHT EMITTING DEVICE, METHOD FOR MANUFACTURING LIGHT EMITTING DEVICE AND LIGHTING SYSTEM HAVING SAME

(71) Applicant: LG INNOTEK CO., LTD., Seoul (KR)

(72) Inventors: Jung Hun Jang, Seoul (KR); Seung Keun Nam, Seoul (KR); Jeong Soon Yim, Seoul (KR); Won Hee Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/577,962

(22) PCT Filed: May 27, 2016

(86) PCT No.: PCT/KR2016/005671
§ 371 (c)(1),
(2) Date: Nov. 29, 2017

(87) PCT Pub. No.: WO2016/195341
PCT Pub. Date: Dec. 8, 2016

(65) Prior Publication Data
US 2018/0145213 A1    May 24, 2018

(30) Foreign Application Priority Data

May 29, 2015 (KR) ........................ 10-2015-0075845

(51) Int. Cl.
*H01L 33/20*  (2010.01)
*H01L 33/22*  (2010.01)
(Continued)

(52) U.S. Cl.
CPC ............ *H01L 33/12* (2013.01); *H01L 33/007* (2013.01); *H01L 33/06* (2013.01); *H01L 33/20* (2013.01);
(Continued)

(58) Field of Classification Search
CPC ......... H01L 33/12; H01L 33/58; H01L 33/42; H01L 33/007; H01L 33/06; H01L 33/20; H01L 33/22; H01L 33/30; H01L 33/0025
See application file for complete search history.

(56) References Cited

U.S. PATENT DOCUMENTS

2005/0218416 A1   10/2005  Cho et al.
2007/0246700 A1   10/2007  Park
(Continued)

FOREIGN PATENT DOCUMENTS

JP    2007-294972      11/2007
KR    10-2005-0096509  10/2005
(Continued)

OTHER PUBLICATIONS

Park et al. Air-voids embedded high efficiency InGaN-light emitting diode. Applied Physics Letters 93, 191103 (2008).*
(Continued)

*Primary Examiner* — Galina G Yushina
(74) *Attorney, Agent, or Firm* — KED & Associates LLP

(57) ABSTRACT

A light emitting device, according to one embodiment, may comprise: a substrate having a pattern part disposed on the upper surface thereof; a first buffer layer disposed on the substrate; a second buffer later disposed on the first buffer layer; a first conductive semiconductor layer disposed on the second buffer layer; an active layer disposed on the first conductive semiconductor layer; a second conductive semiconductor layer disposed on the active layer; and a void layer disposed on the first buffer layer corresponding to the pattern part of the substrate. By further forming a void on the buffer layer, the embodiment has the effect of more effectively preventing defects caused by a potential difference.

10 Claims, 10 Drawing Sheets

(51) Int. Cl.
- *H01L 33/12* (2010.01)
- *H01L 33/00* (2010.01)
- *H01L 33/06* (2010.01)
- *H01L 33/42* (2010.01)
- *H01L 33/58* (2010.01)

(52) U.S. Cl.
CPC .............. *H01L 33/22* (2013.01); *H01L 33/42* (2013.01); *H01L 33/58* (2013.01)

(56) References Cited

U.S. PATENT DOCUMENTS

| | | |
|---|---|---|
| 2012/0199810 A1 | 8/2012 | Lee |
| 2014/0070165 A1 | 3/2014 | Park et al. |
| 2014/0103376 A1* | 4/2014 | Ou .......................... H01L 33/22 257/95 |
| 2015/0372190 A1* | 12/2015 | Hirayama ............... H01L 33/32 257/99 |

FOREIGN PATENT DOCUMENTS

| | | |
|---|---|---|
| KR | 10-2008-0006207 | 1/2008 |
| KR | 10-2012-0129444 | 11/2012 |
| KR | 10-2013-0006976 | 1/2013 |
| KR | 10-2014-0059445 | 5/2014 |

OTHER PUBLICATIONS

Sheu et al. Gallium nitride-based light-emitting diodes with embedded air voids grown on Ar-implanted AIN/Sapphire substrte, Applied Physic Letters 101, 151103 (2012).*
International Search Report (with English Translation) and Written Opinion dated Sep. 9, 2016 issued in Application No. PCT/KR2016/005671.

* cited by examiner

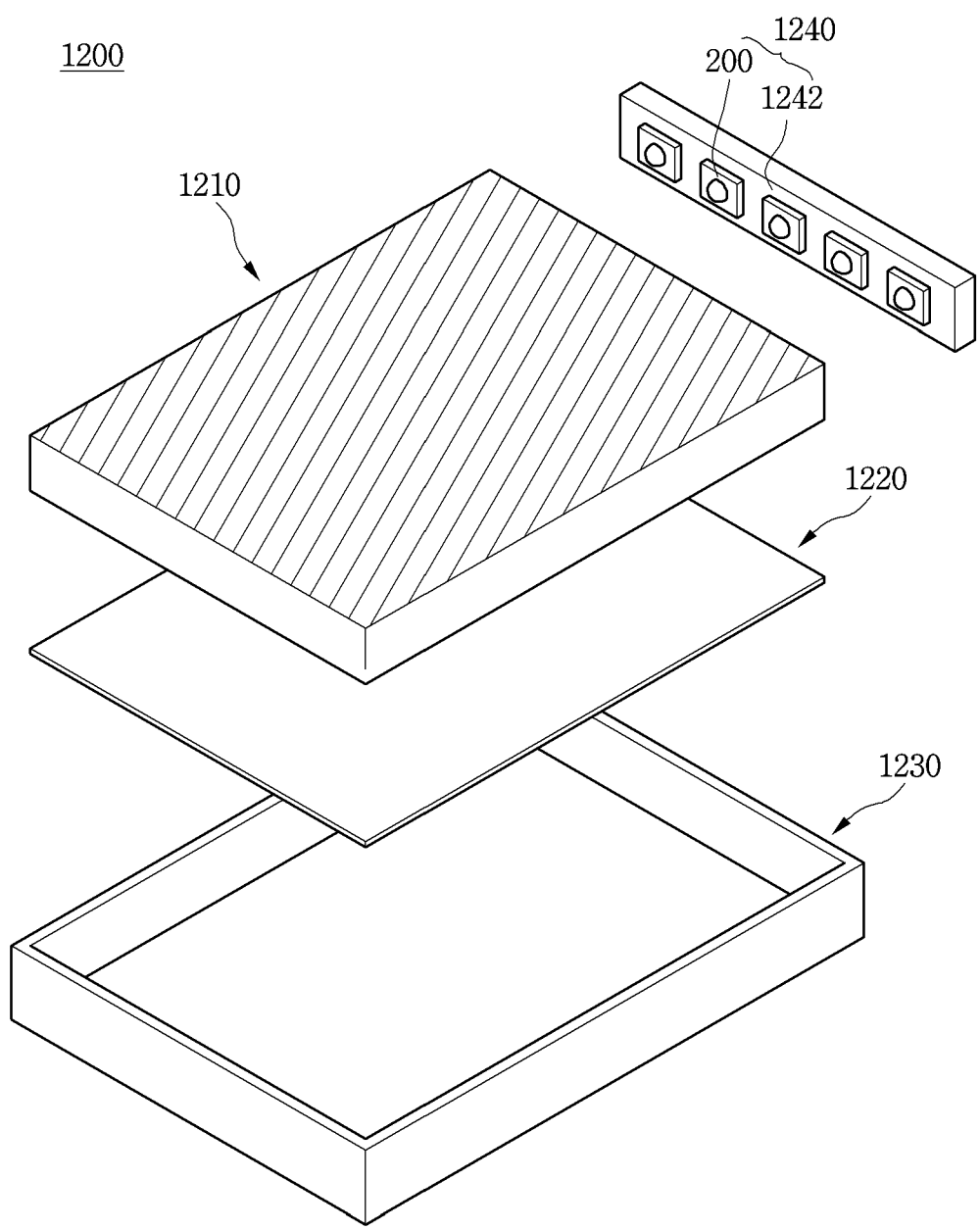

LIGHT EMITTING DEVICE, METHOD FOR MANUFACTURING LIGHT EMITTING DEVICE AND LIGHTING SYSTEM HAVING SAME

CROSS-REFERENCE TO RELATED PATENT APPLICATIONS

This application is a U.S. National Stage Application under 35 U.S.C. § 371 of PCT Application No. PCT/KR2016/005671, filed May 27, 2016, which claims priority to Korean Patent Application No. 10-2015-0075845, filed May 29, 2015, whose entire disclosures are hereby incorporated by reference.

TECHNICAL FIELD

The embodiment relates to a light emitting device, and more particularly, to a light emitting device for improving light efficiency of the light emitting device, a method for manufacturing the light emitting device and a lighting system having the same.

BACKGROUND ART

In general, a light emitting device is a compound semiconductor having a characteristic of converting electrical energy into light energy. The light emitting device may include compound semiconductors belonging to group III and V on the periodic table. The light emitting device can represent various colors by adjusting the composition ratio of the compound semiconductors.

When forward voltage is applied to the light emitting device, electrons of an N layer are combined with holes of a P layer, so that energy corresponding to band gap energy between a conduction band and a valance band may be diverged. The energy is mainly emitted in the form of heat or light. In the case of the light emitting device, the energy is diverged in the form of light. For example, a nitride semiconductor represents high thermal stability and wide band gap energy so that the nitride semiconductor has been spotlighted in the field of optical devices and high-power electronic devices. In particular, blue, green, and ultraviolet (UV) light emitting devices employing the nitride semiconductor have already been commercialized and extensively used.

The conventional nitride semiconductor is formed by sequentially laminating a first conductive semiconductor layer, an active layer, and a second conductive semiconductor layer on a substrate formed of sapphire.

However, the defect due to the potential incurs because of the difference in lattice constant between the sapphire used as the substrate and gallium nitride (GaN), which causes a problem that electrical characteristics and optical characteristics of the light emitting device are deteriorated.

DISCLOSURE

Technical Problem

To solve the above problems, an object of the embodiment is to provide a light emitting device, a method for manufacturing the light emitting device and a lighting system having same, which is configured to prevent deterioration of optical characteristics due to the defect caused by the potential difference generated inside the light emitting device.

Technical Solution

To achieve the above object, the light emitting device according to the embodiment may include a substrate having an upper surface with a pattern part provided on the upper surface, a first buffer layer disposed on the substrate, a second buffer layer disposed on the first buffer layer, a first conductive semiconductor layer disposed on the second buffer layer, an active layer disposed on the first conductive semiconductor layer, a second conductive semiconductor layer disposed on the active layer, and a void layer disposed on the first buffer layer corresponding to the pattern part of the substrate.

In addition, to achieve the above object, the method of manufacturing the light emitting device according to an embodiment includes: preparing a substrate formed thereon with a pattern part including a convex pattern and a concave pattern; forming a first buffer layer on the substrate; forming a second buffer layer on the first buffer layer; forming a first conductive semiconductor layer on the second buffer layer; forming an active layer on the first conductive semiconductor layer; and forming a second conductive semiconductor layer on the active layer, wherein the step of forming the second buffer layer may include forming a void layer on the first buffer layer.

Advantageous Effects

According to the embodiment, aluminum nitride is used as the buffer layer, such that the defect due to the potential difference can be effectively prevented.

In addition, according to the embodiment, a void is further formed on the buffer layer, such that the defect due to the potential difference can be more effectively blocked.

In addition, according to the embodiment, the pattern part is formed on the substrate, such that the defect due to the potential difference can be effectively reduced.

DESCRIPTION OF DRAWINGS

FIGS. 6 to 8 are exploded perspective views illustrating embodiments of a lighting system having a light emitting device according to an embodiment.

BEST MODE

Mode for Invention

Hereinafter, the embodiment will be described in detail with reference to the accompanying drawings.

Figure 1:
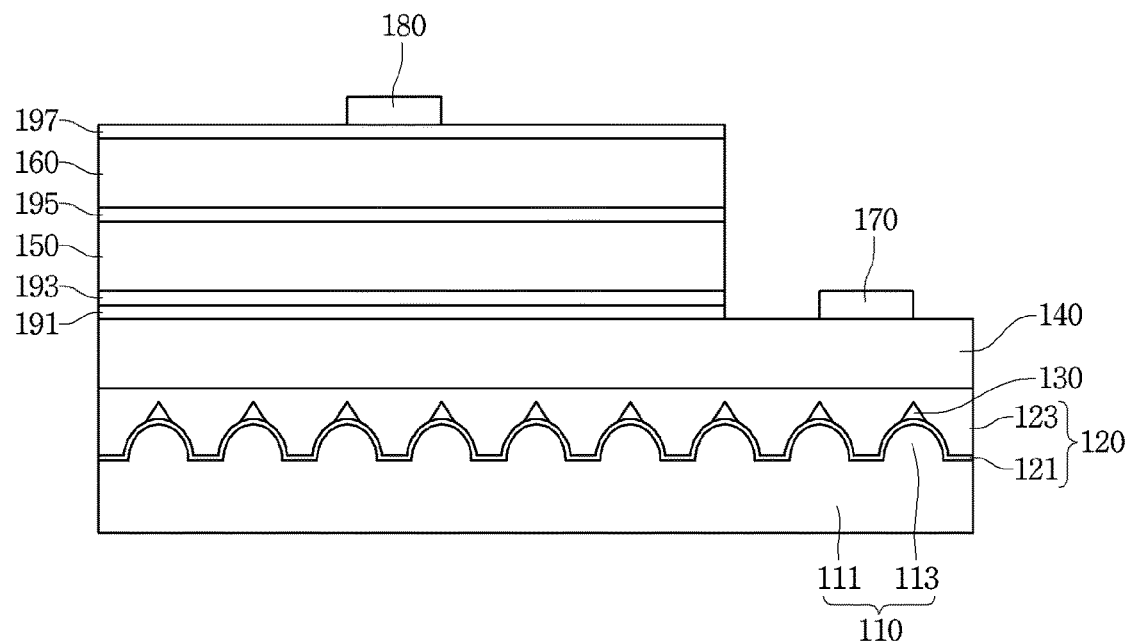
FIG. 1 is a schematic sectional view illustrating a light emitting device formed therein with a void layer according to an embodiment.
Figure 2:
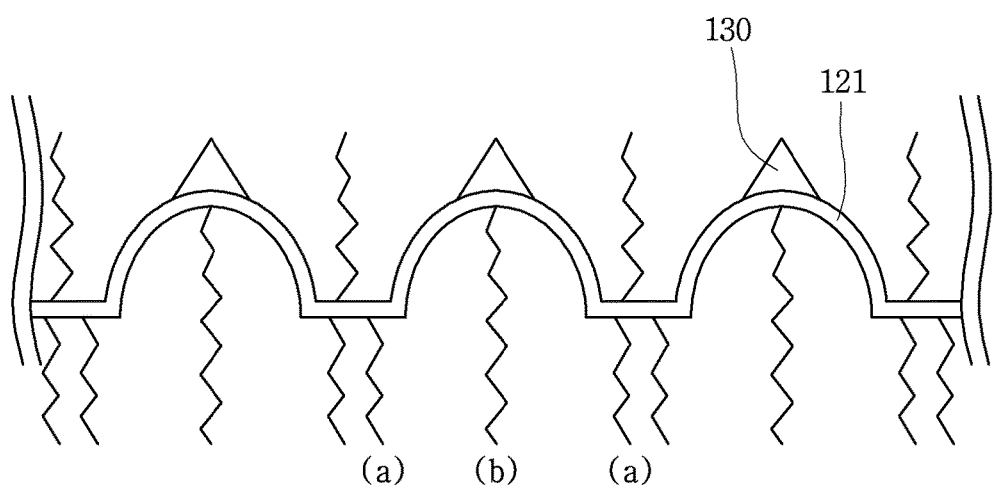
FIG. 2 is a schematic view illustrating a state of blocking a potential of a light emitting device formed therein with a void layer according to an embodiment.

FIG. 1 is a schematic sectional view illustrating a light emitting device formed therein with a void layer according to an embodiment. FIG. 2 is a schematic sectional view illustrating a state of blocking a potential of a light emitting device formed therein with a void layer according to an embodiment.

Referring to FIG. 1, the light emitting device according to an embodiment includes a substrate 110, a first buffer layer 121 disposed on the substrate 110, a void layer 130 disposed on the first buffer layer 121, a second buffer layer 123 disposed on the void layer 130, a first conductive semiconductor layer 140 disposed on the second buffer layer 123, a current diffusion layer 191 and a strain control layer 193 disposed on the first conductive semiconductor layer 140, an active layer 150 disposed on the strain control layer 193, an electron blocking layer 195 disposed on the active layer 150, a second conductive semiconductor layer 160 disposed on the electron blocking layer 195, a transparent electrode layer 197 disposed on the second conductive semiconductor layer 160, a first electrode 170 formed on the first conductive semiconductor layer 140, and a second electrode 180 formed on the transparent electrode layer 197.

The substrate 110 may be formed of a material having high thermal conductivity, and may be a conductive substrate or an insulating substrate. For example, the substrate 110 may be a sapphire ($Al_2O_3$) substrate. At least one of SiC, Si, GaAs, GaN, ZnO, GaP, InP, Ge, and $Ga_2O_3$ may be used as another substrate.

The substrate 110 may include a base substrate 111 and a pattern part 113 formed on the base substrate 111. The pattern part 113 may be formed on an upper portion of the base substrate 111. The pattern part 113 may include a convex pattern and a concave pattern. The pattern part 113 may be formed by etching a portion of the base substrate 110. Alternatively, the pattern part 113 may be formed by forming the convex pattern on the upper portion of the base substrate 111. The pattern parts 113 may be formed on the base substrate 111 while being spaced apart at a predetermined interval. The pattern part 113 may be formed in an island shape.

The above pattern part 113 may prevent a defect due to a potential difference between the substrate 110 formed of the sapphire and the semiconductor layer formed of gallium nitride (GaN).

The first buffer layer 121 may be formed on the substrate 110.

The first buffer layer 121 serves to alleviate a lattice mismatch between the material of the light emitting structure and the substrate 110. The first buffer layer 121 may cover the upper portion of the pattern part 113 of the substrate 110. The first buffer layer 121 may be formed in a shape corresponding to the pattern part 113 of the substrate 110. The first buffer layer 121 may include a convex portion and a concave portion. The first buffer layer 121 may include an aluminum nitride (AlN) material. The first buffer layer 121 is formed of the AlN material, such that the defect due to the potential difference between sapphire and GaN can be reduced.

The void layer 130 may be formed on the first buffer layer 121.

The void layer 130 may be disposed on the first buffer layer 121 corresponding to the pattern part 113 of the substrate 110. The void layer 130 may be disposed to overlap the pattern part 113 of the substrate 110. The void layer 130 may be disposed on the convex pattern of the pattern part 113. The void layer 130 may be disposed to come into contact with an upper surface of the first buffer layer 121.

The void layer 130 may be formed in an island shape. A sectional surface of the void layer 130 may be formed in a triangular shape. Alternatively, the void layer 130 may be formed in a pyramid shape, a triangular pyramid shape, or a conical shape. The void layer 130 may include a plurality of void layers 130. The void layers 130 may be formed in a different size. The void layer 130 may include air. The void layer 130 may block the defect due to the potential difference. In addition, the void layer 130 may refract and reflect light generated in the active layer 150.

The second buffer layer 123 may be formed on the void layer 130.

The second buffer layer 123 may be formed to cover the void layer 130. The second buffer layer 123 may be formed to come into contact with the first buffer layer 121 formed in a region where the void layer 130 is not formed. The second buffer layer 123 may be formed of a gallium nitride (GaN) material.

Alternatively, the second buffer layer 123 may be formed of at least one of group III-V compound semiconductor such as InGaN, AlGaN, and InAlGaN. Alternatively, the second buffer layer 123 may be an undoped gallium nitride layer.

As shown in FIG. 2, when the defect occurs due to the potential difference between sapphire and GaN, the defect may be reduced by the buffer layer 120 and the void layer 130.

The potential formed below the concave pattern of the substrate 110 may be effectively reduced by the first buffer layer 121. The potential formed below the convex pattern of the substrate 110 is partially reduced by the first buffer layer 121, and the reduced defect may be completely blocked by the void layer 130, such that the defect due to the potential difference between the sapphire and the GaN can be minimized.

Returning to FIG. 1, the first conductive semiconductor layer 140 may be formed on the second buffer layer 123.

The first conductive semiconductor layer 140 may be implemented by using a semiconductor compound, for example, a compound semiconductor such as group III-V, group II-VI, and may be doped with an n-type dopant. The n-type dopant may include Si, Ge, Sn, Se, and Te, but is not limited thereto.

On the contrary, the first conductive semiconductor layer 140 may include a semiconductor material having a composition formula of $In_xAl_yGa_{1-x-y}N$ ($0 \leq x \leq 1$, $0 \leq y \leq 1$, $0 \leq x+y \leq 1$). The first conductive semiconductor layer 140 may be formed of at least one of GaN, InN, AlN, InGaN, AlGaN, InAlGaN, AlInN, AlGaAs, InGaAs, AlInGaAs, GaP, AlGaP, InGaP, AlInGaP and InP. In the present embodiment, the first conductive semiconductor layer 140 may be formed of a GaN material.

A current diffusion layer 191 may be formed on the first conductive semiconductor layer 140.

The current diffusion layer 191 may improve the internal quantum efficiency to increase the light efficiency, and may be an undoped GaN layer.

In addition, an electron injection layer (not shown) may be further formed on the current diffusion layer 191. The electron injection layer may be a conductive gallium nitride layer. For example, in the electron injection layer, an n-type doping element is doped at a concentration of $6.0 \times 10^{18}$ atoms/cm$^3$ to $3.0 \times 10^{19}$ atoms/cm$^3$, so that an electron injection can be efficiently performed.

A strain control layer 193 may be formed on the electron diffusion layer 191.

The strain control layer 193 serves to effectively alleviate the stress caused by the lattice mismatch between the first conductive semiconductor layer 140 and the active layer 150. The strain control layer 193 may be formed in a multi-layer structure. For example, the strain control layer 193 may be provided therein with $Al_xIn_yGa_{1-x-y}N$ and GaN as a plurality of pairs.

The lattice constant of the strain control layer 193 may be greater than the lattice constant of the first conductive semiconductor layer 140, however, may be smaller than the lattice constant of the active layer 150. Accordingly, the stress due to the difference of the lattice constant between the active layer 150 and the first conductive semiconductor layer 140 may be minimized.

The active layer 150 may be formed on the strain control layer 193.

The active layer 150 is a layer that emits light having energy determined by the energy band which is inherent in an active layer (light emitting layer) material, after electrons injected through the first conductive semiconductor layer 140 and holes injected through the second conductive semiconductor layer 160 formed later are brought into contact with each other.

The active layer 150 may have at least one of a single quantum well structure, a multi quantum well (MQW) structure, a quantum wire structure, and a quantum dot structure. For example, the active layer 150 may have a multiple quantum well structure by injecting trimethyl gallium gas (TMGa), ammonia gas ($NH_3$), nitrogen gas ($N_2$), and trimethyl indium gas (TMIn), but is not limited thereto.

A well layer/barrier layer of the active layer 150 may have at least one pair structure of InGaN/GaN, InGaN/InGaN, GaN/AlGaN, InAlGaN/GaN, GaAs(InGaAs)/AlGaAs, and GaP(InGaP)/AlGap, but is not limited thereto. The well layer may be formed of a material having a band gap lower than a band gap of the barrier layer.

An electron blocking layer (EBL) 195 may be formed on the active layer 150.

The electron blocking layer 195 serves as blocking the electron and MQW cladding the active layer 150, such that the luminous efficiency may be improved. The electron blocking layer 195 may be formed of a semiconductor based on $Al_xIn_yGa_{(1-x-y)}N$ ($0 \leq x \leq 1$, $0 \leq y \leq 1$), may have an energy band gap higher than an energy band gap of the active layer 150, and may have a thickness of about 100 Å to about 600 Å, but is not limited thereto. On the contrary, the electron blocking layer 195 may be formed of a super lattice of $Al_zGa_{(1-z)}N/GaN$ ($0 \leq z \leq 1$).

The second conductive semiconductor layer 160 may be formed on the electron blocking layer 195.

The second conductive semiconductor layer 160 may be formed of a semiconductor compound, may be implemented by using a compound semiconductor such as group III-V, and group II-VI, and may be doped with a second conductivity dopant.

For example, the second conductive semiconductor layer 160 may include a semiconductor material having a composition formula of $In_xAl_yGa_{1-x-y}N$ ($0 \leq x \leq 1$, $0 \leq y \leq 1$, $0 \leq x+y \leq 1$). The second conductive semiconductor layer 160 may include Mg, Zn, Ca, Sr, and Ba as a dopant.

A transparent electrode layer 197 may be formed on the second conductive semiconductor layer 160.

In the transparent electrode layer 197, a single metal, a metal alloy, a metal oxide or the like may laminated in a multiple state, so that a carrier injection can be efficiently performed. For example, the transparent electrode layer 197 may be formed of a material having an excellent electrical contact with a semiconductor. The transparent electrode layer 197 may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but is not limited to the above materials.

The second electrode 180 is formed on the transparent electrode layer 197, and the first electrode 170 is formed on the first conductive semiconductor layer 140 having a partially exposed upper portion. Then, the first electrode 170 and the second electrode 180 are finally connected to each other, so that manufacturing the light emitting device may be completed.

Hereinafter, the manufacturing process of the light emitting device according to the present invention will be described with reference to FIGS. 3 and 4. FIGS. 3A to 3F are sectional views illustrating a method of manufacturing the light emitting device according to the embodiment.

Referring to FIGS. 3A to 3F, the method of manufacturing the light emitting device according to the embodiment may include: preparing a substrate 110 formed thereon with a pattern part; forming a first buffer layer 121 on the substrate 110; forming a second buffer layer 123 on the first buffer layer 121, and forming a void layer 130 while the second buffer layer 123 is being formed; forming a first conductive semiconductor layer 140 on the second buffer layer 123; forming an active layer 150 on the first conductive semiconductor layer 140; and forming a second conductive semiconductor layer 160 on the active layer 150.

Figure 3A:
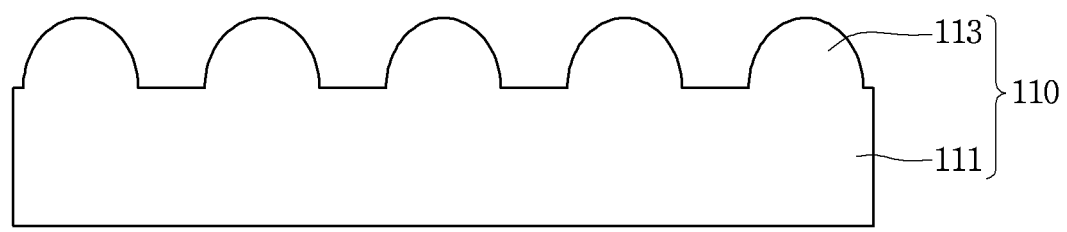
FIGS. 3A to 3F are sectional views illustrating a method of manufacturing the light emitting device according to the embodiment.
Figure 3B:
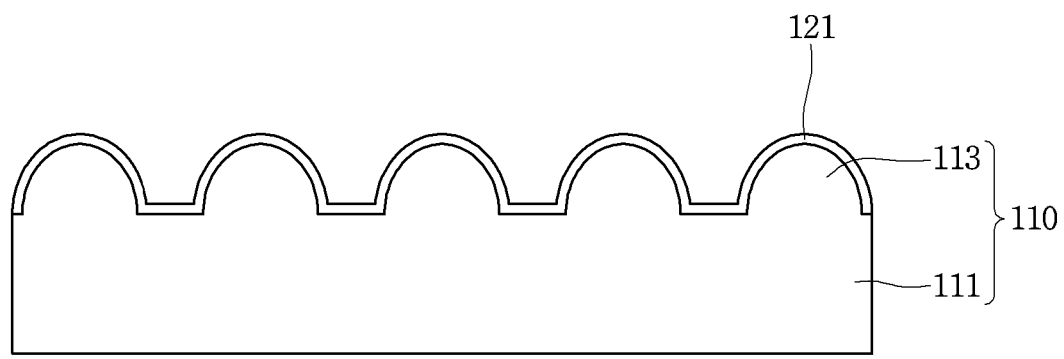

As shown in FIGS. 3A and 3B, preparing a substrate 110 formed of sapphire, and forming the first buffer layer 121 on one surface of the substrate 110 may be performed. The substrate 110 may include the pattern part 113 formed on the upper surface thereof with the convex pattern and the concave pattern.

The first buffer layer 121 may be deposited on the substrate 110 to have a predetermined thickness in a physical vapor deposition (PVD) scheme. The first buffer layer 121 may be formed by a chemical vapor deposition (CVD) scheme, a molecular beam epitaxy (MBE) scheme, or a sputtering scheme, other than the PVD scheme. The first buffer layer 121 may be formed in a shape corresponding to the pattern part 113 of the substrate 110.

Figure 3C:
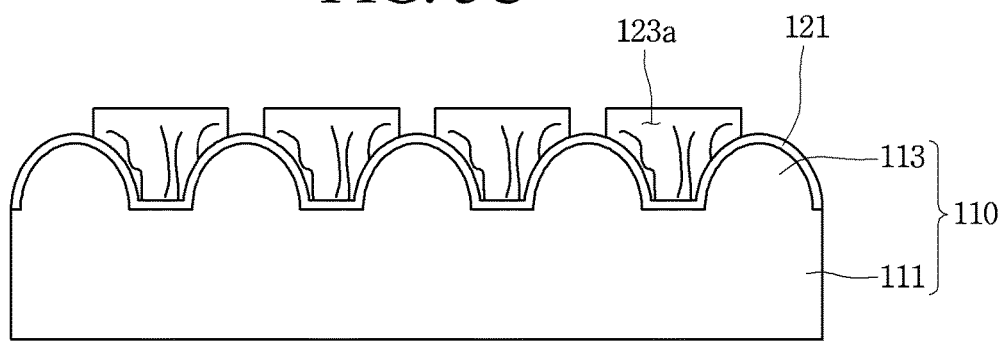

As shown in FIG. 3C, when the first buffer layer 121 is formed on the substrate 110, the step of forming the second buffer layer 123 on the first buffer layer 121 may be performed.

The second buffer layer 123 may be formed of GaN. The second buffer layer 123 may be formed by growing a gallium nitride layer several times. First, a first gallium nitride layer 123a formed of GaN may be grown on the first buffer layer 121. The first gallium nitride layer 123a may be formed on the first buffer layer 121 in a vertical growth scheme of growing the first gallium nitride layer 123a in the vertical direction. The first gallium nitride layer 123a may be formed on the concave pattern of the substrate 110. The first gallium nitride layer 123a may have a thickness of 1 μm to 2 μm. Accordingly, the first gallium nitride layer 123a may be spaced apart from the first gallium nitride layers 123a formed on the adjacent concave patterns. Herein, a plurality of defects may incur in the first gallium nitride layer 123a.

Figure 3D:
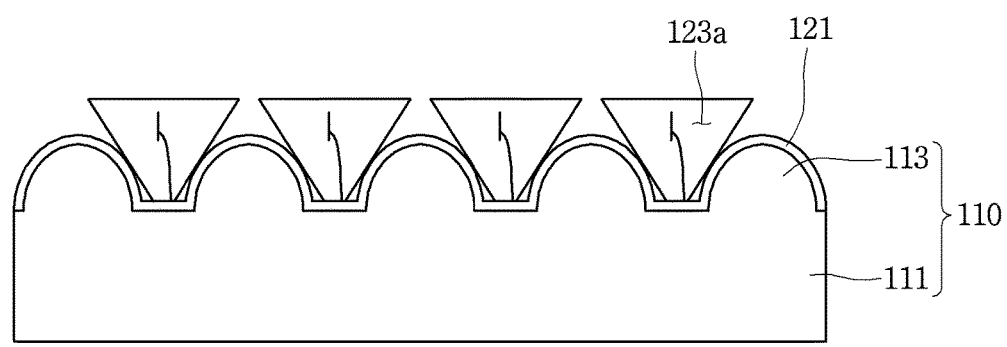

As shown in FIG. 3D, when the first gallium nitride layer 123a is formed on the first buffer layer 121, a step of etching a portion of the first gallium nitride layer 123a may be performed. The first gallium nitride layer 123a may be etched by a wet etching scheme. When the first gallium nitride layer 123a is wet etched, since defects are concentrated in a boundary region between the first buffer layer 121 and the first gallium nitride layer 123a, the etching rate is faster than other regions, such that the first gallium nitride layer 123a may be formed in an inverted pyramid shape.

Figure 3E:
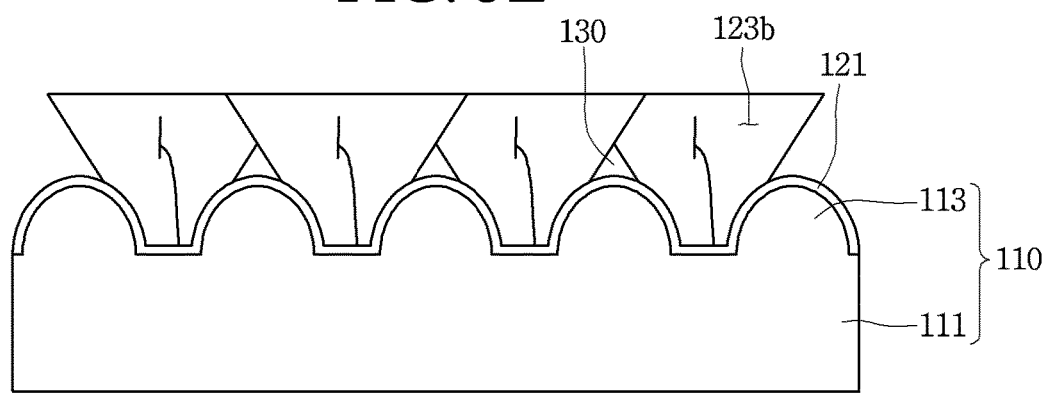

As shown in FIG. 3E, a step of forming a second gallium nitride layer 123b on the first gallium nitride layer 123a may be performed. The second gallium nitride layer 123b may be grown in a vertical growth scheme of growing the second gallium nitride layer 123b in the vertical direction. The void layer 130 may be formed on the first buffer layer 121 while the second gallium nitride layer 123b is being grown. For example, the void layer 130 may be formed on the first buffer layer 121 corresponding to the convex pattern of the substrate 110.

Figure 3F:
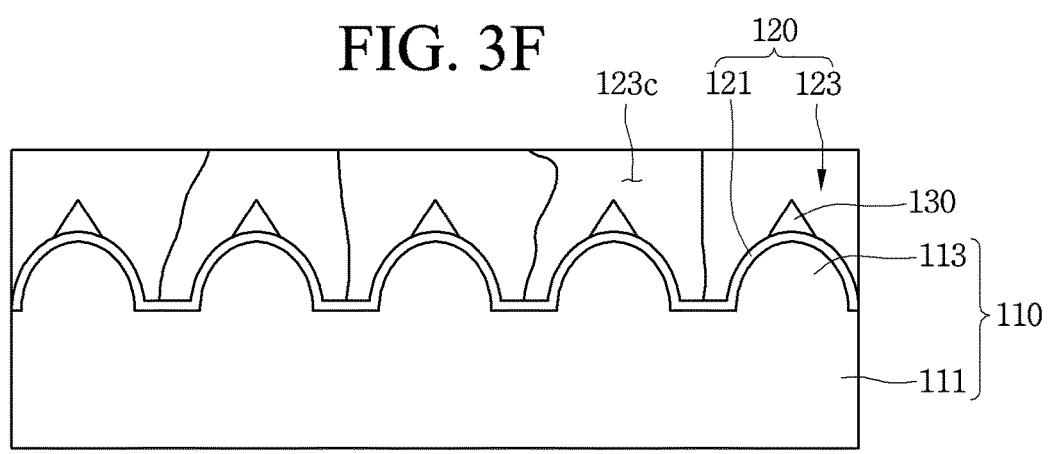

As shown in FIG. 3F, when the second gallium nitride layer 123b is formed to have a predetermined thickness on the first gallium nitride layer 123a, a third gallium nitride layer 123c may be formed on the second gallium nitride layer 123b by the horizontal growth scheme. The third gallium nitride layer 123c is deposited to cover the entire first buffer layer 121 except for the void layer 130, such that the second buffer layer 123 may be finally formed.

Although not shown, when the second buffer layer 123 is formed on the first buffer layer 121, the first conductive semiconductor layer 140, the active layer 150, and the second conductive semiconductor layer 160 may be sequentially formed on the second buffer layer 123. Hereinafter, since the processes of forming the first conductive semiconductor layer 140, the active layer 150, and the second conductive semiconductor layer 160 have general structures, the detailed description will be omitted. Herein, reference numerals are described with reference to FIG. 1.

The first conductive semiconductor layer 140 may be deposited with GaN in a metalorganic chemical vapor deposition (MOCVD) scheme, or deposited with a compound of group III-V or group II-VI. In addition, the first conductive semiconductor layer 140 may be formed by injecting trimethyl gallium gas (TMGa), ammonia gas (NH$_3$), nitrogen gas (N$_2$), and silane gas (SiH$_4$) containing an n-type impurity such as silicon (Si).

The current diffusion layer 191 and the strain control layer 193 may be further formed on the first conductive semiconductor layer 140. The current diffusion layer 191 and the strain control layer 193 may be deposited to have a predetermined thickness by the MOCVD, and the electron injection layer (not shown) may be further formed between the current diffusion layer 191 and the strain control layer 193.

The active layer 150 may be formed on the strain control layer 193.

The active layer 150 may include a well layer formed of GaN or InGaN, and a barrier layer formed of GaN, AlGaN, InGaN or InAlGaN, which can be formed by selectively supplying H$_2$ and/or TMGa (or TEGa), TNin, or TMAl as a source within a range of a predetermined growth temperature, for example, 700° C. to 900° C.

When the active layer 195 is formed on the strain control layer 193, the electron blocking layer 197, the second conductive semiconductor layer 160, and the transparent electrode layer 199 may be further formed on the active layer 150.

The electron blocking layer 195 may be formed by implanting ions into the second conductive semiconductor layer 160, for example, the electron blocking layer 195 may be formed of Al$_x$In$_y$Ga$_{(1-x-y)}$, wherein a composition of Al is in a range of 1% to 30%. The second conductive semiconductor layer 160 may be formed by injecting bis-ethylcyclopentadienyl magnesium (EtCp$_2$Mg) {Mg(C$_2$H$_5$C$_5$H$_4$)$_2$} on the electron blocking layer 195. Accordingly, the second conductive semiconductor layer 160 may be formed thereon with a p-type GaN layer. The transparent electrode layer 197 may be formed by depositing ITO thereon.

When the transparent electrode layer 197 is formed on the second conductive semiconductor layer 160, a mesa etching process may be performed to expose a portion of the first conductive semiconductor layer 140. For example, an upper portion of the first conductive semiconductor layer 140 may be partially exposed by removing portions of the transparent electrode layer 197, the second conductive semiconductor layer 160, the electron blocking layer 195, the active layer 150, the strain control layer 193 and the current diffusion layer 191.

When the upper portion of the first conductive semiconductor layer 140 is partially exposed, the first electrode 170 is formed on the first conductive semiconductor layer 140, and the second electrode 180 is formed on the transparent electrode layer 197, so that manufacturing the light emitting device according to the present invention may be completed.

FIGS. 4A to 4E are sectional views illustrating another method of manufacturing the light emitting device according to the embodiment.

Referring to FIGS. 4A to 4E, the method of manufacturing the light emitting device according to an embodiment may include: preparing a substrate 110 formed thereon with a pattern part; forming a first buffer layer 121 on the substrate 110; forming a second buffer layer 123 on the first buffer layer 121, and forming a void layer 130 while the second buffer layer 123 is being formed; forming a first conductive semiconductor layer 140 on the second buffer layer 123; forming an active layer 150 on the first conductive semiconductor layer 140; and forming a second conductive semiconductor layer 160 on the active layer 150. Herein, the processes of forming the first conductive semiconductor layer 140, the active layer 150, and the second conductive semiconductor layer 160 are same as the above descriptions, accordingly, will be omitted.

Figure 4A:
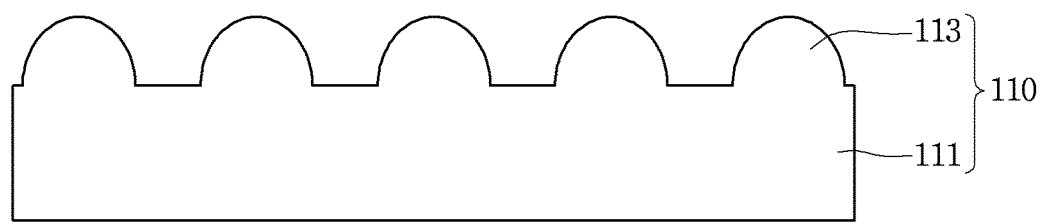
FIGS. 4A to 4E are sectional views illustrating another method of manufacturing the light emitting device according to the embodiment.
Figure 4B:
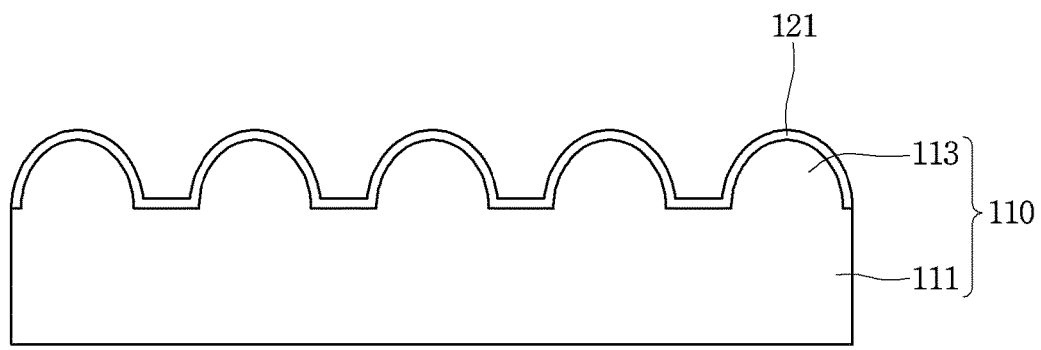

As shown in FIGS. 4A and 4B, preparing a substrate 110 formed of sapphire, and forming the first buffer layer 121 on one surface of the substrate 110 may be performed. The substrate 110 may include the pattern part 113 formed on the upper surface thereof with the convex pattern and the concave pattern.

The first buffer layer 121 may be deposited on the substrate 110 to have a predetermined thickness in a physical vapor deposition (PVD) scheme. The first buffer layer 121 may be formed by a chemical vapor deposition (CVD) scheme, a molecular beam epitaxy (MBE) scheme, or a sputtering scheme, other than the PVD scheme. The first buffer layer 121 may be formed in a shape corresponding to the pattern part of the substrate.

Figure 4C:
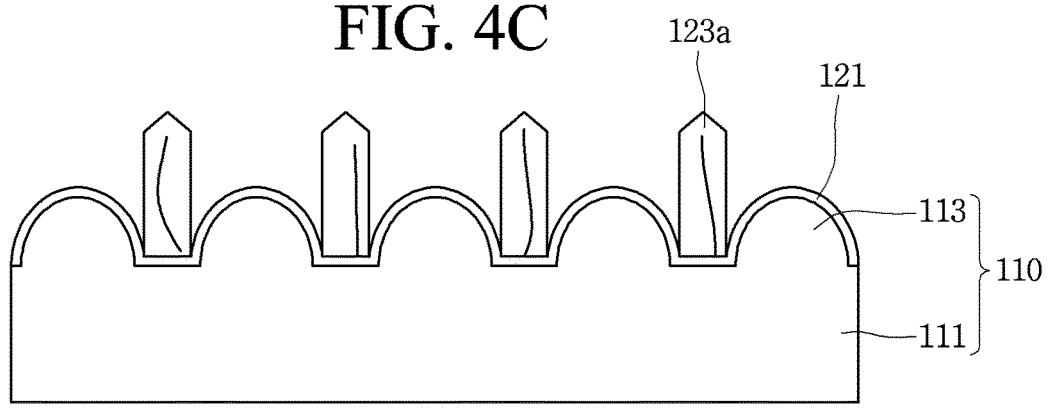

As shown in FIG. 4C, when the first buffer layer 121 is formed on the substrate 110, the step of forming the second buffer layer 123 on the first buffer layer 121 may be performed.

The second buffer layer 123 may be formed of GaN. The second buffer layer 123 may be formed by growing a gallium nitride layer several times. First, a first gallium nitride layer 123a formed of GaN may be grown on the first buffer layer 121. The first gallium nitride layer 123a may be formed on the concave pattern of the substrate 110. The first gallium nitride layer 123a may be formed in a pillar shape. The first gallium nitride layer 123a may be grown at a growth temperature lower than a temperature of a growth condition of other layers, and may have a pillar shape by doping silicon (Si) thereon. The first gallium nitride layer 123a may be spaced apart from the first gallium nitride layers 123a formed on the adjacent concave patterns.

Figure 4D:
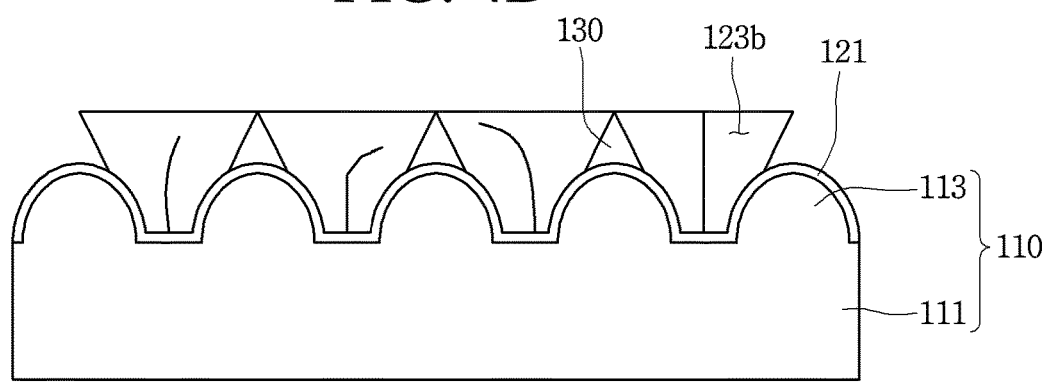

As shown in FIG. 4D, when the first gallium nitride layer 123a is formed on the first buffer layer 121, the second gallium nitride layer 123b may be formed on the first gallium nitride layer 123a by a horizontal growth scheme. The void layer 130 may be formed on the first buffer layer 121 while the second gallium nitride layer 123b is being grown. For example, the void layer 130 may be formed on the first buffer layer 112 corresponding to the convex pattern of the substrate 110.

Figure 4E:
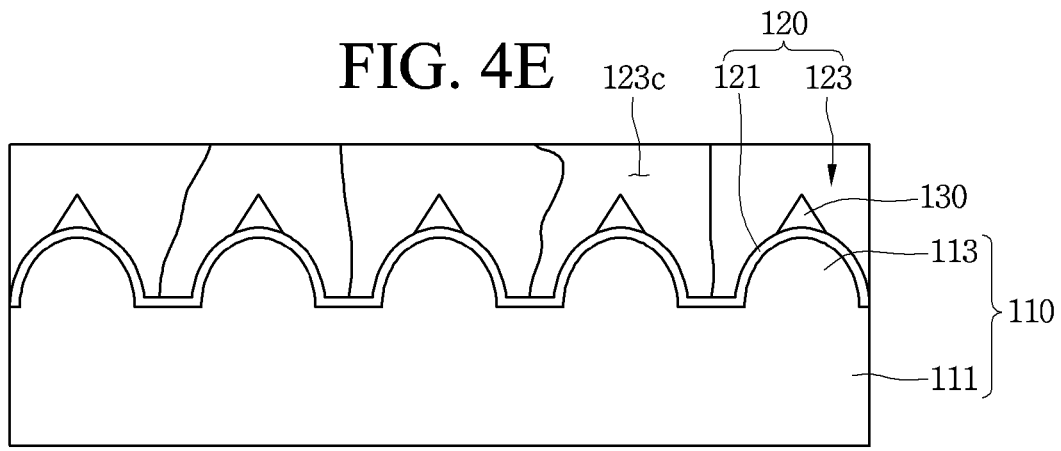

As shown in FIG. 4E, when the second gallium nitride layer 123b is formed on the first gallium nitride layer 123a, a third gallium nitride layer 123c may be formed on the second gallium nitride layer 123b by the horizontal growth scheme. The third gallium nitride layer 123c is deposited to cover the entire first buffer layer 121 except for the void layer 130, such that the second buffer layer 123 may be finally formed.

In the above light emitting device, the void layer is formed by laminating the gallium nitride layers several times, so that the defect due to the potential difference can be effectively prevented.

Figure 5:
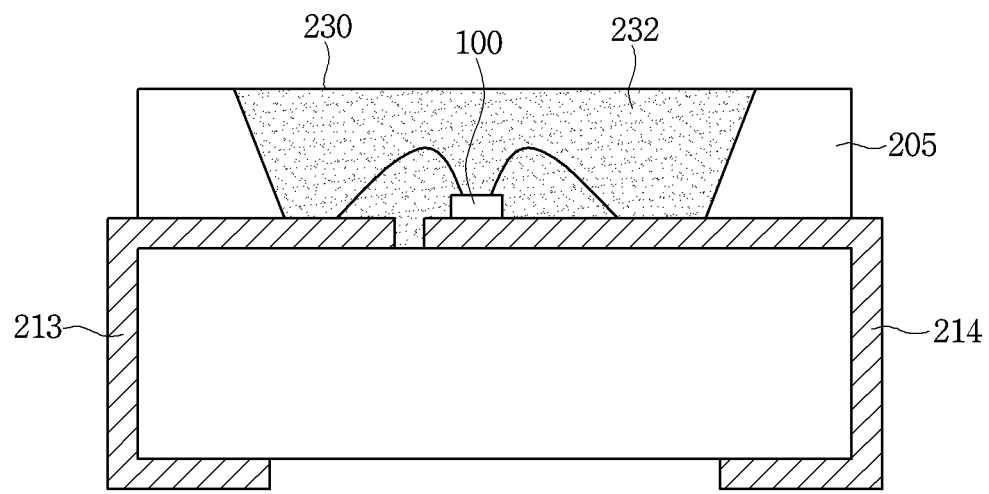
FIG. 5 is a sectional view of a light emitting device package according to an embodiment.

FIG. 5 is a sectional view of a light emitting device package according to an embodiment. The light emitting device package according to the embodiment may be mounted therein with the light emitting device having the above-described structure.

The light emitting device package 200 includes a package body 205, a third electrode layer 213 and a fourth electrode layer 214 disposed on the package body 205, a light emitting device 100 disposed on the package body 205 so as to be electrically connected to the third electrode layer 213 and the fourth electrode layer 214, and a molding member 230 surrounding the light emitting device 100.

The package body 205 may be formed of a silicon material, a synthetic resin material, or a metal material, and an inclined surface may be formed on a periphery of the light emitting device 100.

The third electrode layer 213 and the fourth electrode layer 214 are electrically separated from each other, and serve to provide power to the light emitting device 100. In addition, the third electrode layer 213 and the fourth electrode layer 214 may serve to increase the light efficiency by reflecting light generated from the light emitting device 100, and may serve to discharge heat generated from the light emitting device 100 to the outside.

The light emitting device 100 may be disposed on the package body 205 or on the third electrode layer 213 or the fourth electrode layer 214.

The light emitting device 100 may be electrically connected to the third electrode layer 213 and/or the fourth electrode layer 214 by a wire, flip chip, or die bonding scheme. In the illustrated embodiment, the light emitting device 100 is electrically connected to the third electrode layer 213 and the fourth electrode layer 214 through wires, but is not limited thereto.

The molding member 230 may surround the light emitting device 100, such that the light emitting device 100 can be protected. In addition, the molding member 230 includes a fluorescent substance 232, such that a wavelength of the light emitted from the light emitting device 100 can be changed.

Figure 6:
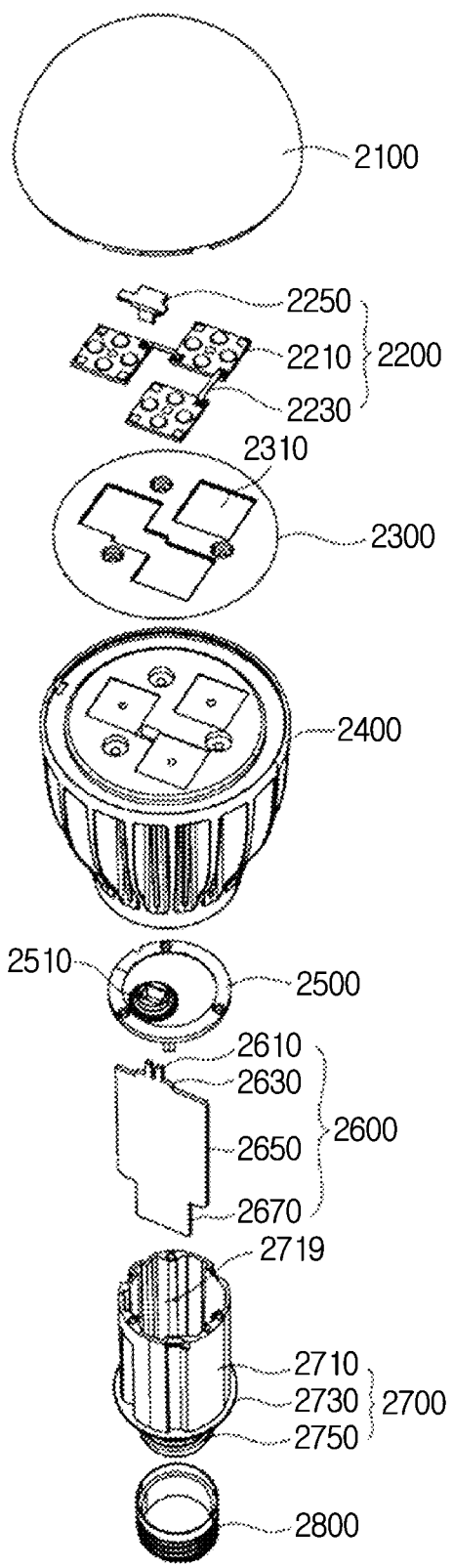
Figure 7:
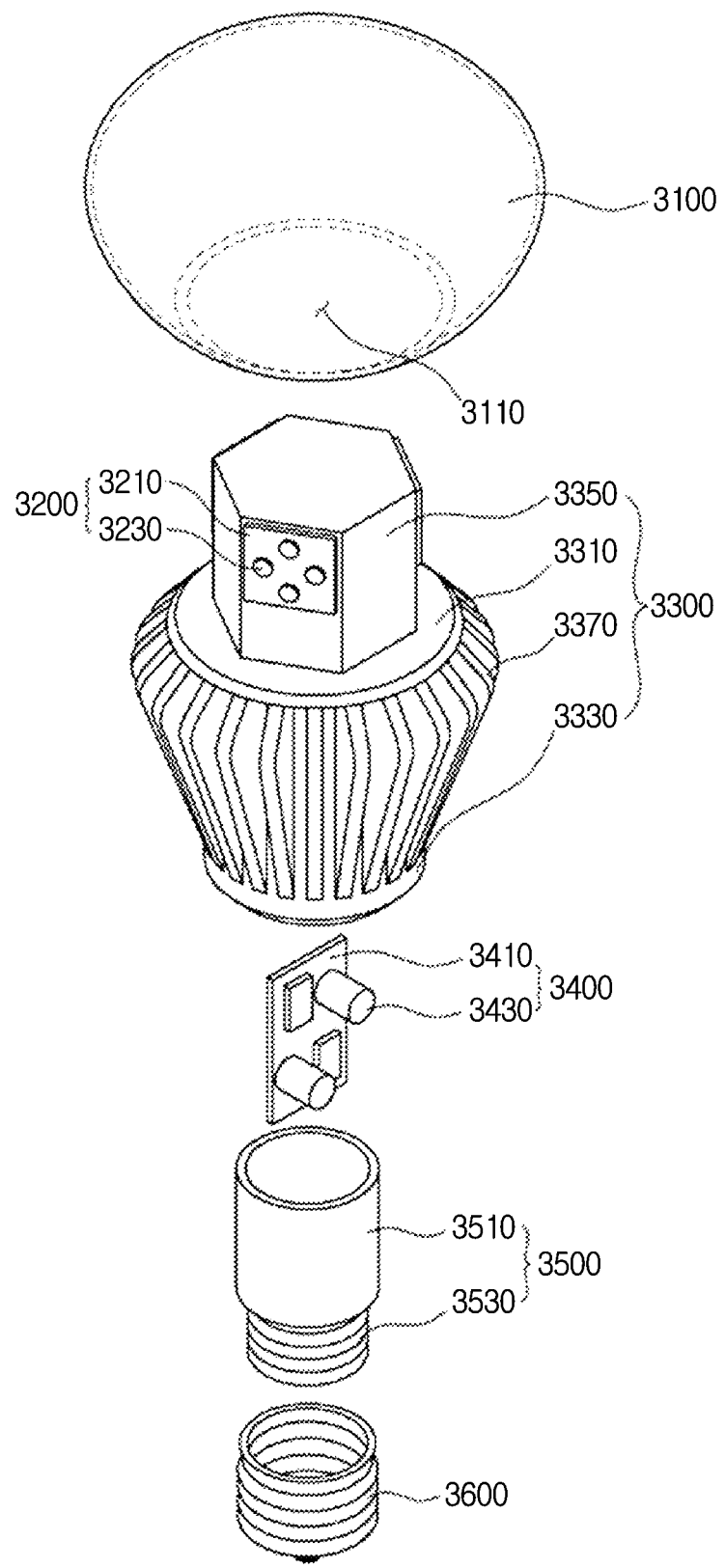

FIGS. 6 to 8 are exploded perspective views illustrating embodiments of a lighting system having a light emitting device according to an embodiment.

As shown in FIG. 6, the lighting apparatus according to the present invention may include a cover 2100, a light source module 2200, a heat sink 2400, a power supply 2600, an inner case 2700, and a socket 2800. In addition, the lighting apparatus according to the embodiment may further include at least one of a member 2300 and a holder 2500. The light source module 2200 may include the light emitting device 100 or the light emitting device package 200 according to the present invention.

For example, the cover 2100 may be formed in a shape of a bulb or a hemisphere, and formed in a hollow and partially opened shape. The cover 2100 may be optically coupled to the light source module 2200. For example, the cover 2100 may diffuse, scatter, or excite light provided from the light source module 2200. The cover 2100 may be a kind of optical member. The cover 2100 may be coupled to the heat sink 2400. The cover 2100 may have a coupling part coupled to the heat sink 2400.

An inner surface of the cover 2100 may be coated with a milky white paint. The milky white paint may include a diffusing material for diffusing light. The surface roughness of the inner surface of the cover 2100 may be greater than the surface roughness of an outer surface of the cover 2100 so as to sufficiently scatter and diffuse the light from the light source module 2200 and discharge the light to the outside.

The cover 2100 may be formed of glass, plastic, polypropylene (PP), polyethylene (PE), polycarbonate (PC), or the like. Herein, the polycarbonate has excellent light resistance, heat resistance and strength. The cover 2100 may be transparent so that the light source module 2200 is visible from the outside, or may be opaque. The cover 2100 may be formed by blow molding.

The light source module 2200 may be disposed on one surface of the heat sink 2400. Accordingly, the heat from the light source module 2200 is conducted to the heat sink 2400. The light source module 2200 may include a light source unit 2210, a connection plate 2230, and a connector 2250.

The member 2300 is disposed on an upper surface of the heat sink 2400, and formed thereon with guide grooves 2310 into which the light source units 2210 and the connector 2250 are inserted. The guide grooves 2310 correspond to the substrate of the light source unit 2210 and the connector 2250.

The surface of the member 2300 may be applied or coated with a light reflecting material. For example, the surface of the member 2300 may be applied or coated with a white paint. The above member 2300 reflects light in the direction of the cover 2100 again when the light returns toward the light source module 2200 after reflected by the inner surface of the cover 2100. Accordingly, the light efficiency of the lighting apparatus according to the embodiment can be improved.

For example, the member 2300 may be formed of an insulating material. The connection plate 2230 of the light source module 2200 may include an electrically conductive material. Accordingly, the heat sink 2400 and the connecting plate 2230 may electrically come into contact with each other. The member 2300 may be composed of an insulating material, such that an electrical short circuit between the connection plate 2230 and the heat sink 2400 can be blocked. The heat sink 2400 receives and dissipates heat from the light source module 2200 and heat from the power supply 2600.

The holder 2500 blocks an accommodating groove 2719 of an insulating part 2710 of the inner case 2700. Accordingly, the power supply 2600 accommodated in the insulating part 2710 of the inner case 2700 is sealed. The holder 2500 has a guide protrusion 2510. The guide protrusion 2510 has a hole through which a protrusion 2610 of the power supply 2600 passes.

The power supply 2600 processes or converts an electrical signal provided from the outside and provides the electrical signal to the light source module 2200. The power supply 2600 is accommodated in the accommodating groove 2719 of the inner case 2700, and sealed inside the inner case 2700 by the holder 2500.

The power supply 2600 may include the protrusion 2610, a guide part 2630, a base 2650, and an extension part 2670.

The guide part 2630 is formed in a shape protruding to the outside from one side of the base 2650. The guide part 2630 may be inserted into the holder 2500. A plurality of components may be disposed on one surface of the base 2650. The components may include, for example, a direct current converter for converting an alternate current power supplied from external power source into direct current power, a driving chip for controlling a drive of the light source module 2200, and an electro static discharge (ESD) protecting device for protecting the light source module 2200, but is not limited thereto.

The extension part 2670 is formed in a shape protruding to the outside from the other side of the base 2650. The extension part 2670 is inserted into a connection part 2750 of the inner case 2700, and provided with an electrical signal from the outside. For example, the extension part 2670 may be provided to be equal to or smaller than a width of the connection part 2750 of the inner case 2700. The extension part 2670 may be electrically connected to one end of each "+ wire" and "− wire", and the other ends of the "+ wire" and the "− wire" may be electrically connected to the socket 2800.

The inner case 2700 may include a molding part together with the power supply 2600. The molding part is a part where molding liquid is hardened, and enables the power supply 2600 to be fixed inside the inner case 2700.

In addition, as shown in FIG. 7, the lighting apparatus according to the present invention may include a cover 3100, a light source part 3200, a heat sink 3300, a circuit part 3400, an inner case 3500, and a socket 3600. The light source part 3200 may include the light emitting device or the light emitting device package according to the embodiment.

The cover 3100 is formed in a bulb shape and is hollow. The cover 3100 has an opening 3110. The light source part 3200 and the member 3350 may be inserted through the opening 3110.

The cover 3100 may be coupled to the heat sink 3300, and surround the light source part 3200 and the member 3350. The light source part 3200 and the member 3350 may be blocked from the outside by coupling the cover 3100 to the heat sink 3300. The cover 3100 may be coupled to the heat sink 3300 through an adhesive, or in various ways such as a rotational coupling scheme and a hook coupling scheme. The rotational coupling scheme is a scheme in which a thread of the cover 3100 is coupled to a screw groove of the heat sink 3300, such that the cover 3100 is coupled to the heat sink 3300 due to the rotation of the cover 3100. The hook coupling scheme is a scheme in which a sill of the cover 3100 is fitted in a groove of the heat sink 3300, such that the cover 3100 is coupled to the heat sink 3300.

The cover 3100 is optically coupled to the light source part 3200. Specifically, the cover 3100 may diffuse, scatter, or excite light from the light emitting device 3230 of the light source part 3200. The cover 3100 may be a kind of optical member. Herein, the cover 3100 may have a fluorescent substance on the inner/outer surface or the inside of the cover to excite the light from the light source part 3200.

The inner surface of the cover 3100 may be coated with a milky white paint. Herein, the milky white paint may include a diffusing material for diffusing light. The surface roughness of the inner surface of the cover 3100 may be greater than the surface roughness of the outer surface of the cover 3100, so as to sufficiently scatter and diffuse the light from the light source part 3200.

The cover 3100 may be formed of glass, plastic, polypropylene (PP), polyethylene (PE), polycarbonate (PC), or the like. Herein, the polycarbonate has excellent light resistance, heat resistance and strength. The cover 3100 may be a transparent material so that the light source part 3200 and the member 3350 are visible from the outside, or may be an invisible opaque material. The cover 3100 may be formed, for example, by blow molding.

The light source part 3200 may be disposed on the member 3350 of the heat sink 3300, and may be disposed in plural. Specifically, the light source part 3200 may be disposed on at least one of side surfaces of the member 3350. In addition, the light source part 3200 may be disposed at an upper end of the side surface of the member 3350.

The light source parts 3200 may be disposed on three of the six side surfaces of the member 3350. However, the present invention is not limited thereto. The light source parts 3200 may be disposed on all side surfaces of the member 3350. The light source part 3200 may include a substrate 3210 and a light emitting device 3230. The light emitting device 3230 may be disposed on one surface of the substrate 3210.

The substrate 3210 has a rectangular plate shape, but may be not limited thereto and have various forms. For example, the substrate 3210 may have a circular or polygonal plate shape. The substrate 3210 may be formed by printing a circuit pattern on an insulator, and may include, for example, a printed circuit board (PCB), a metal core PCB, a flexible PCB, and a ceramic PCB. In addition, a chips on board (COB) type capable of directly bonding an unpackaged LED chip on a printed circuit board may be used. In addition, the substrate 3210 may be formed of a material that efficiently reflects light, or may include a surface having a color such as white and silver capable of efficiently reflecting the light. The substrate 3210 may be electrically connected to the circuit part 3400 accommodated in the heat sink 3300. The substrate 3210 may be connected to the circuit part 3400, for example, via a wire. The wire may pass through the heat sink 3300, thereby connecting the substrate 3210 to the circuit part 3400.

The light emitting device 3230 may be a light emitting diode chip that emits red, green, or blue light, or a light emitting diode chip that emits UV. Herein, the light emitting diode chip may be a lateral type or a vertical type, and the light emitting diode chip may emit blue, red, yellow, or green.

The light emitting device 3230 may have a fluorescent substance. The fluorescent substance may be at least one of a garnet-based (YAG, TAG), a silicate-based, a nitride-based, and an oxynitride-based fluorescent substance. Alternatively, the fluorescent substance may be at least one of a yellow fluorescent substance, a green fluorescent substance, and a red fluorescent sub stance.

The heat sink 3300 may be coupled to the cover 3100, and may dissipate heat from the light source part 3200. The heat sink 3300 has a predetermined volume and includes an upper surface 3310 and a side surface 3330. The member 3350 may be disposed on the upper surface 3310 of the heat sink 3300. The upper surface 3310 of the heat sink 3300 may be connected to the cover 3100. The upper surface 3310 of the heat sink 3300 may have a shape corresponding to the opening 3110 of the cover 3100.

A plurality of heat dissipation fins 3370 may be disposed on the side surface 3330 of the heat sink 3300. The heat dissipation fin 3370 may extend outward from the side surface 3330 of the heat sink 3300 or may be connected to the side surface 3330. The heat dissipation fin 3370 may increase a heat dissipation area of the heat sink 3300 to improve the heat dissipation efficiency. Herein, the side surface 3330 may not include the dissipation fin 3370.

The member 3350 may be disposed on the upper surface 3310 of the heat sink 3300. The member 3350 may be integrated with the upper surface 3310, or may be coupled to the upper surface 3310. The member 3350 may be a polygonal pillar. Specifically, the member 3350 may be a hexagonal pillar. The member 3350 in the hexagonal pillar shape has a top surface, a bottom surface, and six side surfaces. Herein, the member 3350 may be a circular pillar or an oval pillar other than the polygonal pillar. When the member 3350 is the circular pillar or the oval pillar, the substrate 3210 of the light source part 3200 may be a flexible substrate. The light source parts 3200 may be disposed on six side surfaces of the member 3350. The light source parts 3200 may be disposed on all six side surfaces the member 3350, and may be disposed on some of the six side surfaces of the member 3350. In FIG. 6, the light source parts 3200 are disposed on three of the six side surfaces of the member 3350.

The substrate 3210 is disposed on the side surface of the member 3350. The side surface of the member 3350 may be substantially perpendicular to the upper surface 3310 of the heat sink 3300. Accordingly, the substrate 3210 may be substantially perpendicular to the upper surface 3310 of the heat sink 3300.

A material of the member 3350 may be a material having thermal conductivity, such that the heat from the light source part 3200 can be rapidly transferred. The material of the member 3350 may include, for example, aluminum (Al), nickel (Ni), copper (Cu), magnesium (Mg), silver (Ag), and tin (Sn), and an alloy thereof. Alternatively, the member 3350 may be formed of a thermal conductive plastic having thermal conductivity. The thermal conductive plastic is advantageous to be lighter than metals in weight and have unidirectional thermal conductivity.

The circuit part 3400 is supplied with power from the outside, and converts the supplied power so as to be suitable for the light source part 3200. The circuit part 3400 supplies the converted power to the light source part 3200. The circuit part 3400 may be disposed on the heat sink 3300. Specifically, the circuit part 3400 may be accommodated in the inner case 3500, and may be accommodated in the heat sink 3300 together with the inner case 3500. The circuit part 3400 may include a circuit board 3410 and a plurality of components 3430 mounted on the circuit board 3410.

The circuit board 3410 has a circular plate shape, but may be not limited thereto and have various forms. For example, the circuit board 3410 may have an oval or polygonal plate shape. The above substrate 3210 may be formed by printing a circuit pattern on an insulator.

The circuit board 3410 is electrically connected to the substrate 3210 of the light source part 3200. The circuit board 3410 may be electrically connected to the substrate 3210, for example, through a wire. The wire is disposed inside the heat sink 3300, thereby connecting the circuit board 3410 to the substrate 3210.

The components 3430 may include, for example, a direct current converter for converting an alternate current power supplied from external power source into direct current power, a driving chip for controlling a drive of the light source part 3200, and an electro static discharge (ESD) protecting device for protecting the light source part 3200.

The inner case 3500 accommodates the circuit part 3400 therein. The inner case 3500 may have an accommodating part 3510 for accommodating the circuit part 3400.

For example, the accommodating part 3510 may have a cylindrical shape. The shape of the accommodating part 3510 may vary depending on the shape of the heat sink 3300. The inner case 3500 may be accommodated in the heat sink 3300.

The accommodating part 3510 of the inner case 3500 may be accommodated in an accommodating portion formed on a lower surface of the heat sink 3300. The inner case 3500 may be coupled to the socket 3600. The inner case 3500 may have a connection part 3530 coupled to the socket 3600. The connection part 3530 may have a screw thread structure corresponding to a screw groove structure of the socket 3600. The inner case 3500 is non-conductive, thereby preventing an electrical short between the circuit part 3400 and the heat sink 3300. For example, the inner case 3500 may be formed of plastic or resin.

The socket 3600 may be coupled to the inner case 3500. Specifically, the socket 3600 may be coupled to the connection part 3530 of the inner case 3500. The socket 3600 may have the same structure as a conventional incandescent bulb. The circuit part 3400 are electrically connected to the socket 3600. The circuit part 3400 may be electrically connected to the socket 3600, for example, through a wire. Accordingly, when external power is applied to the socket 3600, the external power may be transferred to the circuit part 3400. The socket 3600 may have a screw groove structure corresponding to a screw thread structure of the connection part 3550.

In addition, as shown in FIG. 8, a lighting apparatus such as a backlight unit according to the present invention may include a light guide plate 1210, a light emitting module part 1240 for providing light to the light guide plate 1210, a reflective member 1220 disposed below the light guide plate 1210, and a bottom cover 1230 for accommodating the light guide plate 1210, the light emitting module part 1240, and the reflective member 1220, but is not limited thereto.

The light guide plate 1210 serves to make light into surface light source by diffusing the light. The light guide plate 1210 is formed of a transparent material may include, for example, one of acryl resin series such as polymethyl metaacrylate (PMMA), polyethylene terephthlate (PET), poly carbonate (PC), cycloolefin copolymer (COC), and polyethylene naphthalate (PEN) resin. The light emitting module part 1240 provides light to at least one side surface of the light guide plate 1210, and ultimately serves as a light source of a display apparatus in which the backlight unit is disposed.

The light emitting module part 1240 may come into contact with the light guide plate 1210, but is not limited thereto. Specifically, the light emitting module part 1240 includes a substrate 1242 and a plurality of light emitting device packages 200 mounted on the substrate 1242, in which the substrate 1242 may come in contact with the light guide plate 1210, but is not limited thereto.

The substrate 1242 may be a printed circuit board (PCB) including a circuit pattern (not shown). However, the substrate 1242 may include a metal core PCB (MCPCB), a flexible PCB (FPCB), and the like in addition to a general PCB, but is not limited thereto.

In addition, the light emitting device packages 200 may be mounted on the substrate 1242 such that a light emitting surface, on which the light is emitted, is spaced apart from the light guiding plate 1210 by a predetermined distance.

The reflective member 1220 may be formed below the light guide plate 1210. The reflective member 1220 enables light to be directed upward by reflecting the light incident to the lower surface of the light guide plate 1210, such that the brightness of the backlight unit can be improved. The reflective member 1220 may be formed of, for example, PET, PC, PVC resin or the like, but is not limited thereto.

The bottom cover 1230 may accommodate the light guide plate 1210, the light emitting module part 1240, the reflective member 1220, and the like. To this end, the bottom cover 1230 may be formed in a box shape having an opened upper surface, but is not limited thereto.

The bottom cover 1230 may be formed of a metal material or a resin material, and may be manufactured by using a process such as press molding and extrusion molding.

Although the present invention has been described with reference to drawings and embodiments, it will be apparent to those skilled in the art that various modifications and variations can be made in the embodiments without departing from the technical spirit or scope of the following claims.

INDUSTRIAL APPLICABILITY

The embodiment may improve the reliability of the light emitting device.

The invention claimed is:
1. A light emitting device comprising:
a substrate having an upper surface provided with a pattern part on the upper surface, the pattern part including a plurality of first convex portions and a plurality of first even portions;
a first semiconductor layer on the upper surface of the substrate;
a second semiconductor layer on the first semiconductor layer;
a first conductivity type semiconductor layer on the second semiconductor layer;
an active layer on the first conductivity type semiconductor layer; and
a second conductivity type semiconductor layer on the active layer,
wherein the plurality of first even portion are separated from each other,
wherein the first semiconductor layer includes a plurality of second convex portions and a plurality of second even portions disposed on the pattern part such that each separate one of the second convex portions is on a different one of the first convex portions and each separate one of the second even portions is on a different one of the first even portions,
wherein the second semiconductor layer includes a plurality of air gaps and a plurality of third even portions, wherein only one air gap of the plurality of air gaps is separately disposed on each one of the second convex portions and a corresponding one of the first convex portions, wherein each separate one of the third even portions is on a different one of the second even portions, and a first one of the second even portions of the first semiconductor layer is between a first one of the third even portions of the second semiconductor layer and a first one of the first even portions of the pattern part,
wherein no air gap is disposed on the second even portions of the first semiconductor layer,
wherein each of the air gaps has a top portion created by two inclined planes that are inclined with respect to the second even portions of the first semiconductor layer, and at least one of the air gaps includes a curved bottom portion at an opposite end from the top portion of the at least one of the air gaps, and
the curved bottom portion of the at least one of the air gaps is to directly contact the corresponding second convex portion of the first semiconductor layer, and an entirety of the curved bottom portion is closer to the first conductivity type semiconductor layer than every portion of the substrate and the corresponding first convex portion,
wherein the second semiconductor layer is to directly contact the first semiconductor layer at the plurality of second even portions and at side portions of the plurality of second convex portions of the first semiconductor layer, and the second semiconductor layer is to directly contact the top portion and the two inclined planes of each of the plurality of air gaps, and
wherein a distance between adjacent two inclined planes of each respective air gap decreases as a distance from the corresponding convex portion increases.

2. A lighting system comprising a light emitting device according to claim 1.

3. The light emitting device of claim 1, wherein the first semiconductor layer includes an aluminum nitride (AlN) material.

4. The light emitting device of claim 3, wherein the inclined planes of the at least one of the air gaps directly contact the corresponding second convex portion of the first semiconductor layer.

5. The light emitting device of claim 4, wherein the second semiconductor layer comprises a GaN-based semiconductor layer,
wherein an Al composition of the first semiconductor layer is larger than an Al composition of the second semiconductor layer.

6. The light emitting device of claim 5, wherein the first conductivity type semiconductor layer, the second conductivity type semiconductor layer, and the active layer comprise AlGaN-based semiconductor,
wherein the active layer emits a light having a wavelength of a peak intensity in an ultra-violet range.

7. The light emitting device of claim 6, comprising:
a first electrode electrically connected to the first conductivity type semiconductor layer;
a second electrode electrically connected to the second conductivity type semiconductor layer;
a transparent electrode disposed between the second conductivity type semiconductor layer and the second electrode.

8. The light emitting device of claim 7, wherein the transparent electrode is made of at least one material selected from the group consisting of ITO, Ti, Ni, and Al.

9. The light emitting device of claim 1, wherein the first semiconductor layer has a first material, and the second semiconductor layer has a second material that is different than the first material, wherein a thickness of the second semiconductor layer is greater than a thickness of the first semiconductor layer, wherein the second semiconductor layer has a first area and a second area, the first area corresponds to an area of the second semiconductor layer above the second convex portion of the first semiconductor layer, and the second area corresponds to an area of the second semiconductor layer above the second even portion above the first semiconductor layer, wherein a thickness of the second area is greater than a thickness of the first area.

10. A light emitting device comprising:

a substrate having an arrangement on an upper surface;

a first semiconductor layer on the upper surface of the substrate;

a second semiconductor layer on the first semiconductor layer;

a first conductivity type semiconductor layer on the second semiconductor layer;

an active layer on the first conductivity type semiconductor layer; and a second conductivity type semiconductor layer on the active layer, wherein the first semiconductor layer includes a plurality of convex portions and a plurality of even portions on the arrangement, wherein one of the even portions is between two adjacent convex portions, wherein the second semiconductor layer includes a plurality of air gaps and a plurality of even portions, wherein only one air gap of the plurality of air gaps is separately disposed on each one of the convex portions of the first semiconductor layer, wherein air gaps are so small that each air gap is disposed only on a top of the convex portion, wherein each separate one of the even portions of the second semiconductor layer is on a different one of the even portions of the first semiconductor layer, and a first one of the even portions of the first semiconductor layer is between a first one of the even portions of the second semiconductor layer and an even portion of the arrangement, wherein no air gap is disposed on the even portions of the first semiconductor layer, wherein at least one of the air gaps separately includes at least two surfaces that extend from the corresponding convex portion in a direction away from the substrate to provide a top portion created by the at least two surfaces, and the at least one of the air gaps includes a curved bottom portion at an opposite end from the top portion of the at least one of the air gaps, the curved bottom portion of the at least one of the air gaps is to directly contact the corresponding convex portion of the first semiconductor layer, and an entirety of the curved bottom portion is closer to the first conductivity type semiconductor layer than every portion of the substrate and the arrangement, wherein the second semiconductor layer is to directly contact the first semiconductor layer at the plurality of convex portions and at side portions of the plurality of convex portions of the first semiconductor layer, and the second semiconductor layer is to directly contact the top portion and the at least two surfaces, wherein a distance between the at least two surfaces decreases as a distance from the corresponding convex portion increases.

* * * * *